United States Patent
Yang

(10) Patent No.: US 7,242,083 B2
(45) Date of Patent: Jul. 10, 2007

(54) SUBSTRATE FOR IC PACKAGE

(75) Inventor: Hsin-Chen Yang, Taichung County (TW)

(73) Assignee: Lingsen Precision Industries Ltd., Taichung (TW)

( * ) Notice: Subject to any disclaimer, the term of this patent is extended or adjusted under 35 U.S.C. 154(b) by 253 days.

(21) Appl. No.: 11/109,734

(22) Filed: Apr. 20, 2005

(65) Prior Publication Data
US 2006/0220219 A1   Oct. 5, 2006

(30) Foreign Application Priority Data
Apr. 1, 2005   (TW) .............................. 94205140 U

(51) Int. Cl.
H01L 23/48   (2006.01)
H01L 23/52   (2006.01)

(52) U.S. Cl. ............... 257/692; 257/693; 257/697; 257/784

(58) Field of Classification Search ............... 257/692, 257/693, 696, 784, 697
See application file for complete search history.

(56) References Cited

U.S. PATENT DOCUMENTS 5,371,029 A * 12/1994 Abdo et al. ................... 29/846
5,825,084 A * 10/1998 Lau et al. ................... 257/700
6,441,453 B1 * 8/2002 Tindle .......................... 257/437
6,509,560 B1 * 1/2003 Glenn et al. ................. 250/239
6,979,897 B2 * 12/2005 Ma .............................. 257/691
7,078,791 B1 * 7/2006 Tindle et al. ............... 257/680
2003/0085455 A1 * 5/2003 Roeters et al. .............. 257/686
2006/0197234 A1 * 9/2006 Pape ........................... 257/784

FOREIGN PATENT DOCUMENTS

EP   0098114   * 1/1984
JP   60-7140   * 1/1985

* cited by examiner

Primary Examiner—S. V. Clark
(74) Attorney, Agent, or Firm—Browdy and Neimark, PLLC

(57) ABSTRACT

A packaging substrate is formed of an array of packaging units. Each packaging unit has a chip pad carrying a chip, a plurality of pins arranged around the chip pad and spaced from one another and the chip pad by an open space, an insulative member formed of a plurality of insulative member layers and filled up the open space, and a set of electrical elements, which includes a plurality of plated through holes cut through the insulative member layers, first lead wires embedded in the insulative member to electrically connect the plated through holes to one another, and second lead wires that connect the plated through holes to a respective adjacent pin.

5 Claims, 2 Drawing Sheets

SUBSTRATE FOR IC PACKAGE

BACKGROUND OF THE INVENTION

1. Field of the Invention

The present invention relates to a substrate for integrated circuit (IC) package and more particularly, to such a packaging substrate, which allows electric connection between two remote pins.

2. Description of the Related Art

Following fast development of technology, it has become the market trend to provide electronic products having lighter, thinner, shorter and smaller characteristics. To fit this market trend, high-performance ICs are developed. From the application of early metal lead frame package technology to current flip chip technology, packaging substrate fabrication has been continuously improved. The invention pertains to improvement on QFN (Quad Flat No-lead) packaging substrate technology.

QFN semiconductor packaging technology has been intensively used in semiconductor foundries for years for packaging semiconductor products. Several QFN packaging technology based patents have been disclosed. Recently, there are manufacturers to secure pins to the packaging substrate by means of half-etching the packaging substrate to make openings among the pins of the lead frame and then filling up the openings with an insulative member to form a platform. The platform can has a chip pad that carries a chip. Passive components or multiple electronic elements may be installed in the platform, increasing space utilization of the packaging substrate.

The aforesaid method of filling up the openings with an insulative member to form a platform greatly increase the usable area of the packaging substrate, however the passive components can only be electrically connected to the adjacent pins, i.e., the aforesaid method does not allow electric connection between two remote pins.

SUMMARY OF THE INVENTION

The present invention has been accomplished under the circumstances in view. It is one object of the present invention to provide a packaging substrate, which allows electric connection between two remote pins.

To achieve this object of the present invention, the packaging substrate comprises a plurality of packaging units arranged in an array. Each packaging unit comprises at least one chip pad each carrying a chip, and a plurality of pins arranged around the at least one chip pad and spaced from one another and the at least one chip pad by an open space; wherein the packaging units each further comprise an insulative member filled up the open space. The insulative member includes a plurality of insulative member layers laminated together. At least one set of electrical elements has a plurality of plated through holes respectively formed in the insulative member layers, and at least one lead wire embedded in the insulative member to electrically connect the plated through holes to one another. The number of the plated through holes is equal to the number of the insulative member layers.

DETAILED DESCRIPTION OF THE INVENTION

Figure 1:
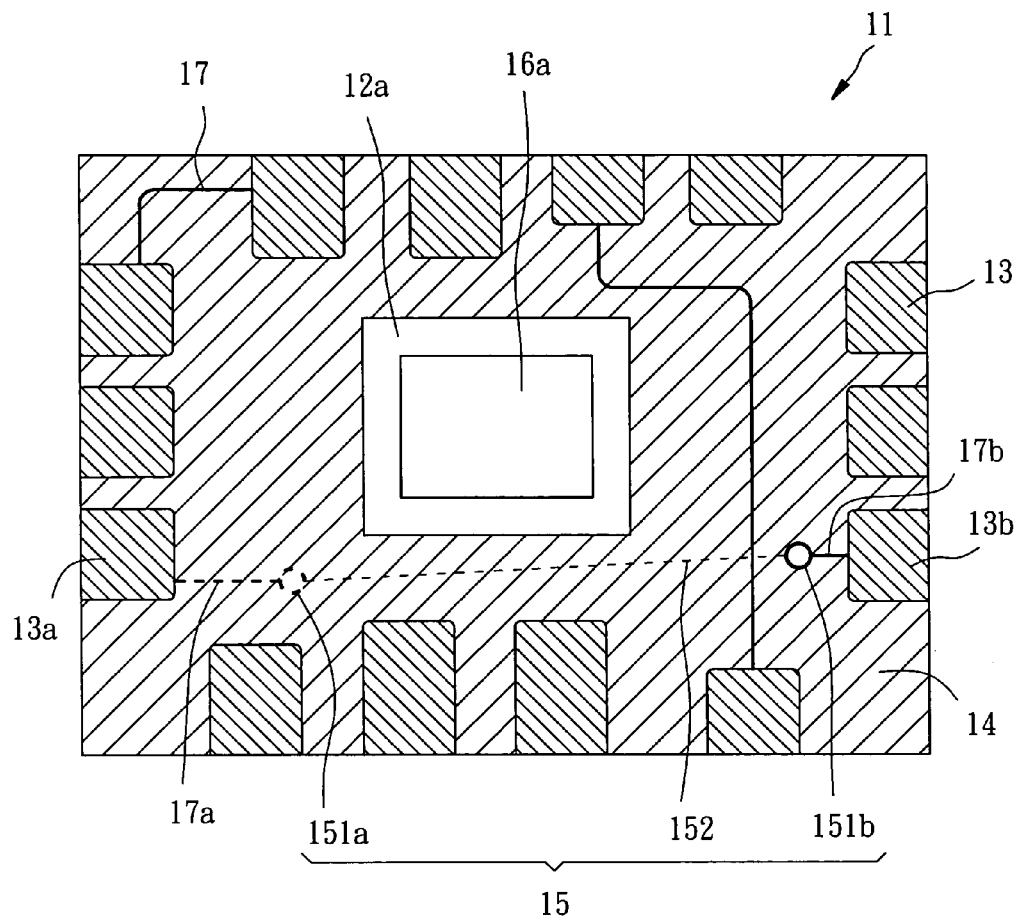
FIG. 1 is a top view of one packaging unit of a packaging substrate according to a first preferred embodiment of the present invention.
Figure 2:
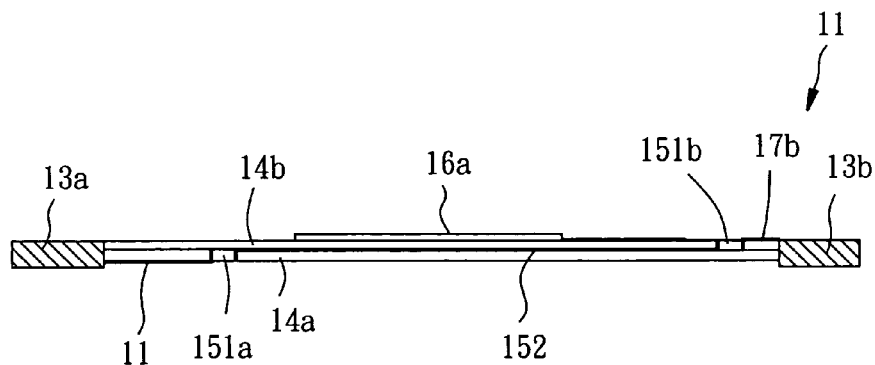
FIG. 2 is a sectional view of the packaging unit shown in FIG. 1.

A packaging substrate (not shown) in accordance with the first embodiment of the present invention is comprised of a plurality of packaging units 11, as shown in FIGS. 1–2, arranged in an array. The packaging units 11 have a flat, rectangular shape, each comprised of a chip pad 12a, a plurality of pins 13, an insulative member 14, and a set of electrical elements 15.

The chip pad 12a has a chip 16a bonded thereto with a solder paste. The pins 13 are arranged along the border of the respective packaging unit 11 around the chip pad 12a. The pins 13 are respectively spaced from the chip pad 12a and spaced from one another by openings.

The insulative member 14 includes two insulative member layers 14a and 14b laminated together to fill up the openings between the pins 13 and the chip pad 12a and between each two adjacent pins 13, thereby forming with the pins 13 and the chip pad 12a a unitary platform.

The electrical elements 15 include two plated through holes 151a and 151b, and a lead wire 152. The plated through holes 151a and 151b are formed in the insulative member 14 and cut through the first insulative member layer 14a and the second insulative member layer 14b. The lead wire 152 is a wire of nickel alloy arranged in between the first insulative member layer 14a and the second insulative member layer 14b and electrically connected between the two plated through holes 151a and 151b. Further, two lead wires 17a and 17b are respectively electrically connected between the bottom end of the first plated through hole 151a and the pin 13a adjacent to the first plated through hole 151a and the top end of the second plated through hole 151b and the pin 13b adjacent to the second plated through hole 151b, keeping the two remote pins 13b and 13b electrically connected together. The aforesaid arrangement eliminates the problem that the lead wires 17 that connect the pins 13 cannot be crossed over one another on a plane, and increases the space utilization of the packaging substrate.

Figure 3:
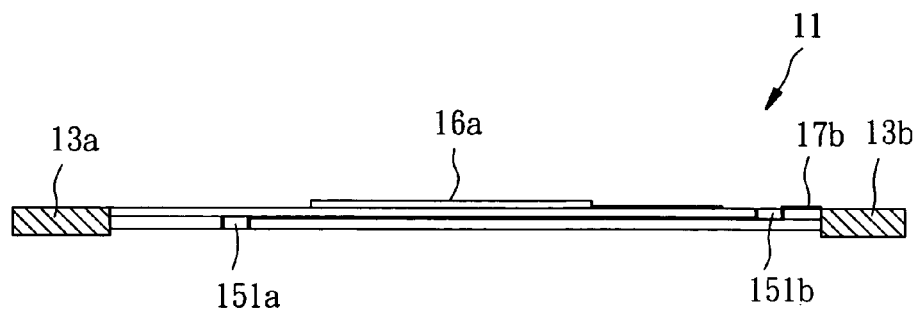
FIG. 3 is a sectional view of a packaging unit of a packaging substrate according to a second preferred embodiment of the present invention.

FIG. 3 shows a packaging substrate according to the second embodiment of the present invention. This embodiment is substantially similar to the aforesaid first embodiment with the exception that the aforesaid lead wire 17a that is embedded in each packaging unit 11 is eliminated and, the bottom end of the first plated through hole 151a is exposed to the outside of the insulative member 14a for use as a land for the connection of other electrical device.

Figure 4:
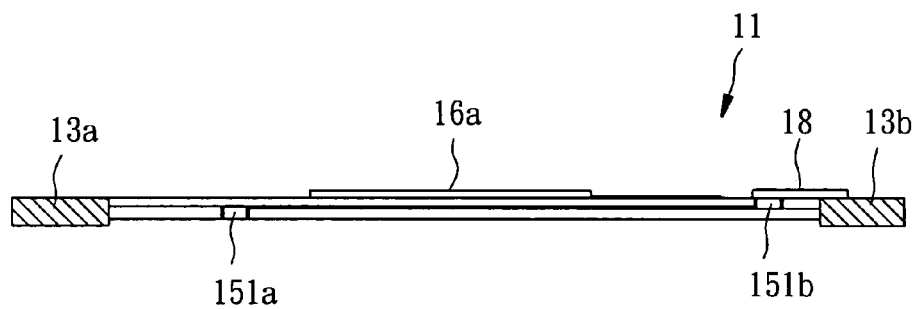
FIG. 4 is a sectional view of a packaging unit of a packaging substrate according to a third preferred embodiment of the present invention.

FIG. 4 shows a packaging substrate according to the third embodiment of the present invention. This embodiment is substantially similar to the aforesaid second embodiment with the exception of the use of a passive component 18 to substitute for the lead wire 17b and to electrically connect the top end of the second plated through hole 151b to the pin 13b adjacent to the second plated through hole 151b.

Figure 5:
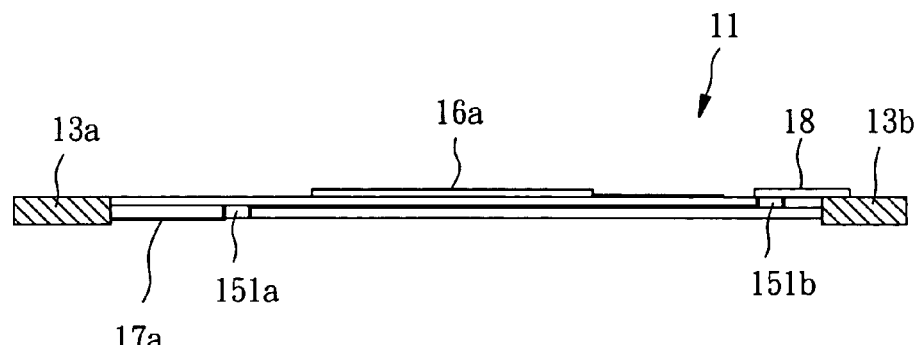
FIG. 5 is a sectional view of a packaging unit of a packaging substrate according to a fourth preferred embodiment of the present invention.

FIG. 5 shows a packaging substrate according to the fourth embodiment of the present invention. This embodiment is substantially similar to the aforesaid first embodiment with the exception of the use of a passive component 18 to substitute for the lead wire 17*b* and to electrically connect the top end of the second plated through hole 151*b* to the pin 13*b* adjacent to the second plated through hole 151*b*.

Although particular embodiments of the invention have been described in detail for purposes of illustration, various modifications and enhancements may be made without departing from the spirit and scope of the invention. For example, three or more insulative member layers may be laminated together to fill up the openings between the pins and the chip pad in each packaging unit and between each two adjacent pins in each packaging unit; two or more sets of electrical elements may be set in the insulative member. Accordingly, the invention is not to be limited except as by the appended claims.

What is claimed is:

1. A packaging substrate comprising a plurality of packaging units arranged in an array, said packaging units each comprising:

at least one chip pad on which a chip is carried; and a plurality of pins arranged around said at least one chip pad and spaced from one another and said at least one chip pad by an open space;

wherein said packaging units each further comprise:

an insulative member filled up said open space, said insulative member having a plurality of insulative member layers laminated together;

at least one set of electrical elements having a plurality of plated through holes respectively formed in said multiple insulative member layers, the number of said plated through holes being equal to the number of said multiple insulative member layers, and at least one lead wire embedded in said insulative member to electrically connect said plated through holes to one another.

2. The packaging substrate as claimed in claim 1, wherein the plated through holes of said at least one set of electrical elements are respectively formed in said multiple insulative member layers at different elevations.

3. The packaging substrate as claimed in claim 1, wherein said plated through holes of said at least one set of electrical elements include at least one plated through hole formed in the topmost layer of said multiple insulative member layers and respectively electrically connected to a respective adjacent one of said pins with a respective lead wire.

4. The packaging substrate as claimed in claim 1, wherein said plated through holes of said at least one set of electrical elements include at least one plated through hole formed in the topmost layer of said multiple insulative member layers and respectively electrically connected to a respective adjacent one of said pins with a respective passive component.

5. The packaging substrate as claimed in claim 1, wherein said plated through holes of said at least one set of electrical elements include at least one plated through hole formed in the lowest layer of said multiple insulative member layers and respectively electrically connected to a respective adjacent one of said pins with a respective lead wire.

* * * * *